(12) United States Patent
Imark et al.

(10) Patent No.: US 6,718,498 B2
(45) Date of Patent: Apr. 6, 2004

(54) METHOD AND APPARATUS FOR THE REAL TIME MANIPULATION OF A TEST VECTOR TO ACCESS THE MICROPROCESSOR STATE MACHINE INFORMATION USING THE INTEGRATED DEBUG TRIGGER

(75) Inventors: Robert R. Imark, Fort Collins, CO (US); Daniel A. Berkram, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 475 days.

(21) Appl. No.: 09/873,874

(22) Filed: Jun. 4, 2001

(65) Prior Publication Data
US 2002/0184588 A1 Dec. 5, 2002

(51) Int. Cl.[7] .......................... G01R 31/28; G06F 11/00
(52) U.S. Cl. ........................ 714/741; 703/15; 714/33
(58) Field of Search ................ 714/741, 33; 703/15

(56) References Cited

U.S. PATENT DOCUMENTS

| | | | |
|---|---|---|---|
| 3,927,371 A | * 12/1975 | Pomeranz et al. | 714/740 |
| 5,745,501 A | * 4/1998 | Garner et al. | 714/741 |
| 5,818,850 A | 10/1998 | Tsai et al. | |
| 5,859,962 A | * 1/1999 | Tipon et al. | 714/33 |
| 5,867,644 A | 2/1999 | Ranson et al. | |
| 5,968,195 A | * 10/1999 | Ishiyama | 714/727 |
| 6,269,319 B1 | * 7/2001 | Neisch et al. | 702/118 |

* cited by examiner

Primary Examiner—Albert Decady
Assistant Examiner—Joseph D. Torres

(57) ABSTRACT

The invention includes a method of and an apparatus for testing an integrated circuit which includes simulating the integrated circuit and generating an input vector to and expected output from the integrated circuit. This input vector and expected output are generated by entering test vectors into the circuit simulator and the integrated circuit is tested using the input vector to yield a first resulting output. A test hardware vector is also created to capture state information pertaining to the integrated circuit. The test hardware vector and the input vector are combined to create a joint input vector and debugging is performed on the integrated circuit by modifying the joint input vector and evaluating the resulting output.

20 Claims, 3 Drawing Sheets

METHOD AND APPARATUS FOR THE REAL TIME MANIPULATION OF A TEST VECTOR TO ACCESS THE MICROPROCESSOR STATE MACHINE INFORMATION USING THE INTEGRATED DEBUG TRIGGER

TECHNICAL FIELD

The field of the invention generally relates to testing of integrated circuit designs, and more specifically built-in test systems which utilize integrated debug circuitry incorporated within the integrated circuit under test.

BACKGROUND

During the development of integrated circuits, particularly in Large Scale Integrated Circuits (LSICs), various software tools are utilized to check and test the operation and functionality of the circuits under test. Two software tools that are commonly utilized are state and timing simulators.

The state simulator is software that emulates a circuit under test, such as a LSIC. The purpose of the state simulator is to mimic the circuit under test so that inputs to and outputs from the circuit under test can be identified. One or more test vectors are entered into the state simulator in order to produce inputs, and determine the resulting outputs for the circuit under test. A test vector is essentially a set of logic states that are imposed upon corresponding nodes in the circuit under test. A set of test vectors typically make up each test case. The test vectors are entered into the state simulator sequentially, usually one vector per clock phase. The state simulator produces state data, which is essentially a large matrix of logic values for nodes in a circuit, for each phase transition, or time step, as determined by the state simulator. For a given set of test vectors, the state simulator identifies the input for the circuit under test (microprocessor test input) and the output for the circuit under test (expected microprocessor output).

A timing simulator is software that determines timing information for each logical path contained in the circuit under test. In general, a timing simulator measures elapsed time for signals to propagate to the circuit elements by providing the times at which each input signal arrives at each node in a path relevant to a clock. Paths are usually scored in order of speed so that a designer can find ways to speed up a slow path and thus enable a higher frequency of operation. The timing data that is produced by the timing simulator includes a list of paths, typically ordered slow to fast, with the time that each transition occurred at each node for each path.

Other software tools are available in the industry for collecting node toggle (transition) information, "stuck at" information and delay fault information. These tools focus on process defects, typically, one fault at a time.

U.S. Pat. No. 5,818,850, (the "'850 patent") assigned to the assignee of the present invention, entitled Speed Coverage Tool And Method, issued Oct. 6, 1998, and hereby incorporated herein by reference in its entirety, describes a test coverage tool and method to determine the adequacy of test vectors for a state simulator for exercising logical paths in a logical circuit design. The speed coverage tool of the '850 patent generally compares state data from a state simulator and timing data from a timing simulator in order to validate whether a set of test vectors cover a simulated timing test.

Once the microprocessor test inputs and the expected microprocessor outputs are identified using the state simulator and other software tools, the microprocessor test inputs are applied to the circuit under test. Ideally, the results from the circuit under test would match the expected microprocessor outputs previously obtained from the state simulator. Once these vectors agree, the testing of the circuit under test is completed and the functionality of the circuit under test has been determined to be correct.

More often than not, the actual microprocessor output from the circuit under test does not match the expected microprocessor output obtained from the state simulator. Troubleshooting on the circuit under test must then be undertaken to determine the problems internal to the circuit. It has become very difficult to diagnose failures in, and to measure the performance of, state of the art microprocessors such as LSICs. This is because modern microprocessors not only run at very high clock speeds, but many of them also execute instructions in parallel, out of program order, and speculatively. Moreover, visibility of the microprocessors' inner state has become increasingly limited due to complexity of the microprocessors and of practical constraints on the number of external pads, or test points, that can be provided on the circuit under test for testing purposes.

In the past, the traditional failure, diagnosis and performance measurement tools have been external logic analyzers and in-circuit emulators. Logic analyzers are capable of monitoring signals on the chip pads, test points, or other externally accessible system signals, and capturing the state of these signals. Unfortunately, logic analyzers rely solely on externally accessible signals to accomplish this, and do not directly monitor test signals that are internal to the chip itself. In-circuit emulators, on the other hand, are used to mimic the functional characteristics of a new microprocessor in a system environment and to add visibility to certain data values within a microprocessor. Such devices emulate the functionality of the microprocessor. By their very nature, they cannot give a complete and accurate representation of the performance characteristics of an actual silicon device. Therefore, they are primarily useful only for developing and debugging system software.

U.S. Pat. No. 5,867,644, (the "'644 patent") entitled System And Method For On-Chip Debug Support And Performance Monitoring In A Microprocessor, issued Feb. 2, 1999 to Gregory Ranson, is assigned to the assignee of the present invention, and is incorporated herein in its entirety. The '644 patent describes user configurable diagnostic hardware which is contained on the chip with a microprocessor for the purpose of debugging and monitoring the performance of the microprocessor. A programmable state machine is used in the '644 patent and is coupled to on-chip and off-chip input sources. The programmable state machine may be programmed to look for signal patterns presented by the input sources, and to respond to the occurrences of a defined pattern (or sequence of defined patterns) by driving certain control information onto a state machine output bus. On-chip devices coupled to the output bus take user definable action as dictated by the bus. The input sources include on-chip user configurable comparators located within the functional blocks of a microprocessor. The comparators are also coupled to storage elements within the microprocessor, and are configured to monitor nodes to determine whether the states of the nodes match the data contained in the storage elements. The programmer may change the information against which the states of the nodes are compared as well as the method by which the comparisons are made by changing data in the storage elements. Counters may also be included in the output device and may be used as state machine inputs, so one event may be defined as a function of a different event having occurred a certain number of times. The output device typically also includes circuitry for generating internal and external triggers. User configurable multiplexer circuitry may be used to route user selectable signals from within the microprocessor to the chip's output pads, and to select various internal signals to be used as state machine inputs.

Once a problem is identified within a circuit under test, on-board diagnostic hardware can be used to troubleshoot the circuit. However, before the on-board diagnostics can be used, they must be configured correctly for the testing desired. This is typically done by a test hardware vector. Additionally, the circuit under test must be placed in a known state, which is typically performed with vector initialization code.

Therefore, once a problem has been identified in a circuit under test, there are three vectors associated with this additional debug testing when onboard diagnostic hardware is used: a vector initialization code places the circuit under test into a known state; a microprocessor test input is used to test the functionality of the circuit under test, and a test hardware vector is used to ensure the diagnostic hardware onboard the circuit under test is configured correctly to receive and store test data. These last two vectors, the microprocessor test vector input and the test hardware vector are combined into an integrated debug trigger image. Ideally, the output of the circuit under test when it receives the integrated debug trigger would be the expected microprocessor output. However, the presence of the test hardware vector can affect the output of the circuit under test so that, even when the circuit under test is operating correctly, an output other than the expected microprocessor output is obtained. When the result differs from the expected microprocessor output, the tester is unsure if the output is a result of a faulty circuit or the effect of the test hardware vector. Therefore, before the integrated debug trigger image is loaded into the circuit under test, the expected effects of the test hardware vector on the expected microprocessor output must be "backed out" (i.e., eliminated or minimized) to ensure the expected microprocessor output is received when the circuit under test is operating correctly. This iterative process currently requires numerous runs through the state simulator software to ensure the correct expected microprocessor output is known. Each of these runs may require several hours of computer time to complete.

SUMMARY OF THE INVENTION

A need exists for a testing system and method which will allow the tester to combine the microprocessor test input with the test hardware input in a manner that ensures the expected microprocessor output is not affected. A further need exists for a user interface which will allow the combination of the microprocessor test input and the test hardware input without requiring the resulting integrated debug trigger image be rerun through the state simulator. A further need exists to combine the microprocessor test input and the test hardware input in real or near-real time.

The invention is directed to a method and apparatus for real time manipulation of a test vector or test case to access microprocessor state machine information using an integrated debug trigger. The invention preferably includes the ability to manipulate a "failing" vector and insert a code fragment to program the integrated debug trigger without disrupting the failing test vector or test case. The invention preferably simplifies and allows the real time programming of the integrated debug trigger, also known as the logic analyzer, which previously required resimulation of the integrated debug trigger code. That is, the invention preferably provides for immediate or real time editing of the integrated debug trigger vector using appropriate vector tester hardware and/or software and includes the ability to add the integrated debug trigger vector on the test vector initialization without disrupting the test case vector.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, and erasable ROM (EROM), a floppy diskette, a compact disk CD-ROM, an optical disk, a hard disk, etc., while transmission media may include, for example, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, an intranet, etc.

DETAILED DESCRIPTION

According to one aspect of the invention, generation and real time manipulation of a test vector includes four main components including: vector tester hardware, appropriate initialization vector for initializing a microprocessor to a known state, an integrated debug trigger, and a test case image vector. To access the microprocessor's machine information on a particular cycle of the test case vector, the vector initialization code is run on the microprocessor under test, followed by the code to program the integrated debug trigger, and then a partial version of vector initialization code. At this point, the original test case image vector is executed. This partial version of vector initialization code makes the microprocessor state machine behave as if running with the full vector initialization code, without resetting the integrated debug trigger state machine. The partial version of vector initialization code synchronizes the vector with the original test case image vector. Therefore, the user may modify the integrated debug trigger vector, allowing the microprocessor to stop at a specific time and enable acquisition of the microprocessor internal state information via an appropriate scan mechanism. The vector tester may include an appropriate digital IC test system, such as the HP 83000 Model F330 general-purpose VLSI test system.

Figure 1:
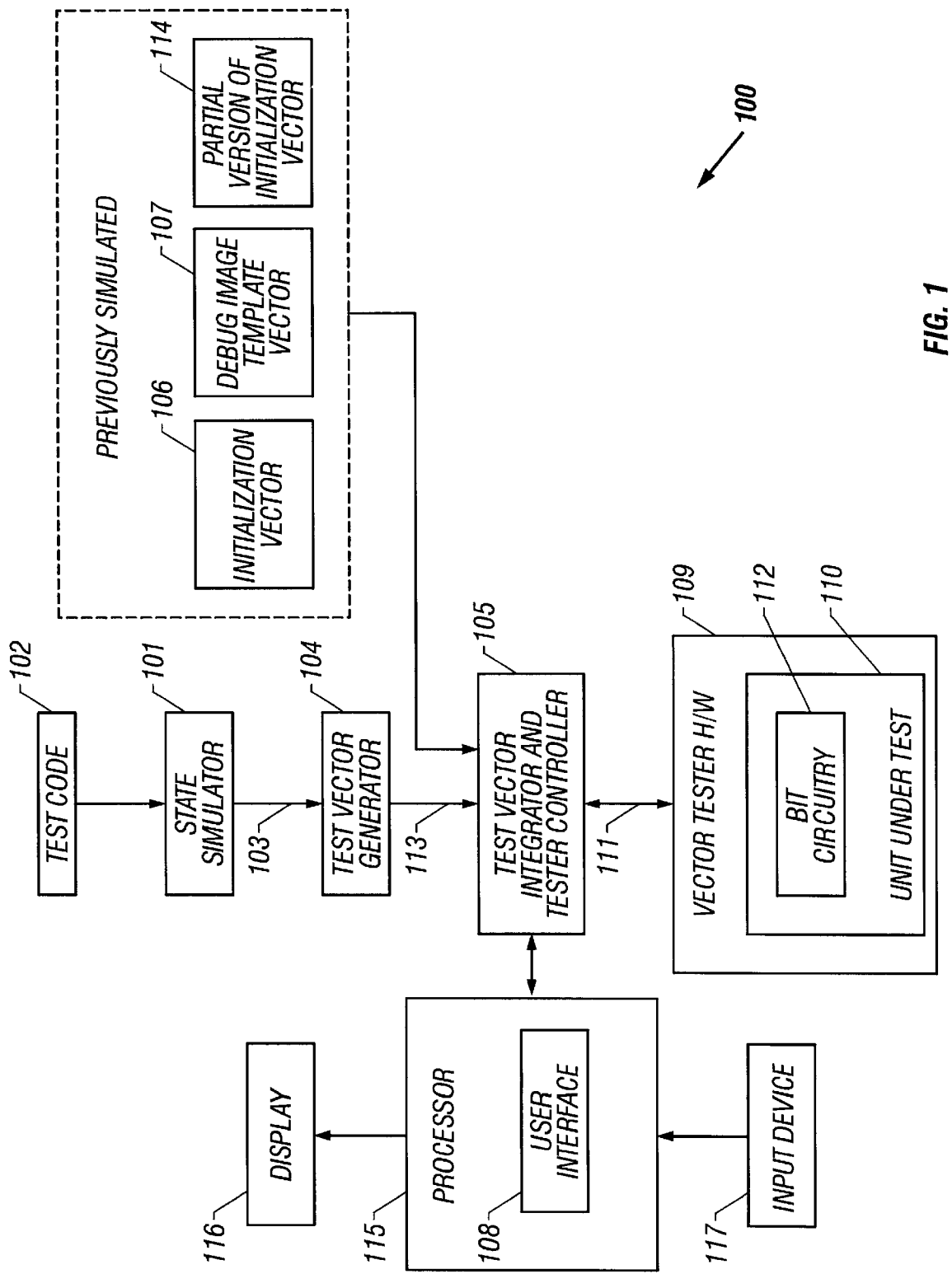
FIG. 1 is a block diagram of a system for real time manipulation of a test vector according to the invention.

FIG. 1 is a block diagram of a test system according to the invention. The system includes a state simulator 101 used to simulate test case code 102 to provide a chip interface test vector such as microprocessor test vector 103. Microprocessor test vector 103 is supplied to test vector generator 104 which functions as a vector converter in that it converts microprocessor test vector 103 to produce test case image vector 113. Test case image vector 113 is supplied to Test Vector Integrator and Tester Controller 105 which manipulates test case image vector 113 together with partial version of initialization vector 114 and debug image template vector 107 in response to input provided by a user via user interface 108. The user interface 108 may include a processor, a display and appropriate input devices such as keyboard, mouse etc. The debug image template vector 107 includes instructions and data where the data may be modified as required by the user. This modification by the user does not impact the instruction stream sent to the microprocessor 110. Test vector integrator and tester controller 105 also controls vector tester hardware 109 in which unit under test 110 has been placed. Test vector integrator and tester controller 105 provide the insertion of image vector 111 to vector tester hardware 109. Whenever the vector tester hardware 109 detects a mismatch between the behavior of the unit under test 110 and the image vector 111, vector tester hardware 109 sends the mismatch data back to test vector integrator and tester controller 105. When a mismatch occurs the user can read the mismatched data and manipulate the inputs to test vector integrator and tester controller 105 to create a revised image vector used for subsequent testing. These inputs may be manipulated manually by the user or may be programmed for repeated observations. Additionally, the full functionality of the onboard logic analyzer is also available to the user as described in U.S. Pat. No. 5,867,644 entitled System And Method For On-Chip Debug Support And Performance Monitoring In A Microprocessor, issued Feb. 2, 1999 to Gregory Ranson which has been previously incorporated by reference.

Referring again to FIG. 1, when power is applied to microprocessor 110, a portion of the microprocessor is initialized by a reset signal. Microprocessor 110 attempts to fetch instructions at a specific address where the instructions are supplied by the part of image vector 111, which corresponds to initialization vector 106. Each time microprocessor 110 attempts to access additional data, that data is also supplied by the part of image vector 111 which corresponds to initialization vector 106. This continues until part of the image vector 111 which contains the initialization vector information is consumed. In a non debug mode of operation, microprocessor 110 would run the test case image vector immediately following the part of image vector 111 which corresponds to initialization vector 106. Once this data is consumed, the instructions are supplied by the part of image vector 111, which contains debug image template vector 107. These instructions are supplied by the Vector Tester Hardware 109 and are processed by the microprocessor in the same manner as the data from the part of image vector 111 which corresponds to initialization vector 106. The part of image vector 111 which contains a partial version of initialization vector 114 is consumed similarly. As previously described, this portion of the image vector 111 which contains a partial version of initialization vector 114 makes the microprocessor state machine behave as if running with the full vector initialization code without resetting the integrated debug trigger state machine. The part of the image vector which corresponds to the test case image vector 113 is executed similarly.

Figure 2:
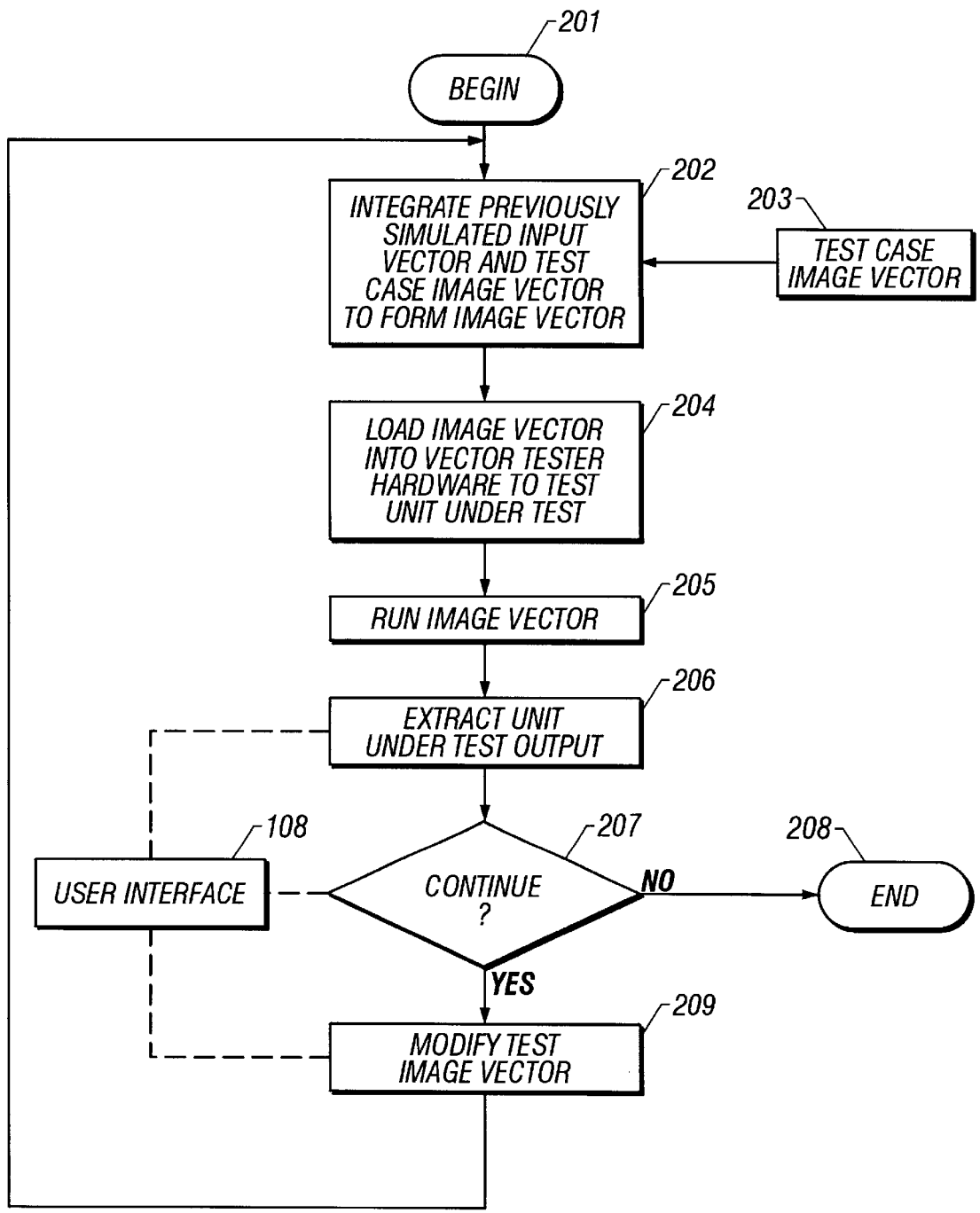
FIG. 2 is a method according to the invention for real time manipulation of a test vector.

The operation of apparatus 100 (FIG. 1) is more fully described now in connection with FIG. 2 of the drawings. The method begins at step 201, and at step 202, the previously simulated input vector and test case image vector from step 203 are integrated to form an image vector. At step 204 the image vector is loaded into vector tester hardware to test the unit under test. The image vector is run on the unit under test at step 205, and at step 206, test output is extracted from the unit under test, via the vector tester hardware. The extracted output is displayed, via user interface 108, on appropriate display 116. The user interface 108 works in conjunction with processor 115 and the user interacts with processor 115 via input device 117. In step 207, a determination is made by the user as to whether the test is performed again with a modified test image vector. The user may establish various criteria for testing and refinement of the test image vector. For example, if the actual output from the microprocessor is sufficiently close to a precalculated expected output, the user may elect to terminate further testing and processing terminates at step 208. Conversely, if the output obtained from the microprocessor under test is not acceptable, then the user may elect to continue to refine the test image vector in an attempt to converge to an acceptable test image vector result. In another scenario, the user may elect to modify the test image vector to obtain test data from previous or subsequent cycles of the microprocessor under test, running a sequence of tests to obtain a continuum of test outputs and reconstruct the evolving state of the microprocessor. Thus, at step 209, the user, using user interface 108 and display 116 and input device 117, may modify the test image vector and rerun generation of a new image vector at step 202.

Figure 3:
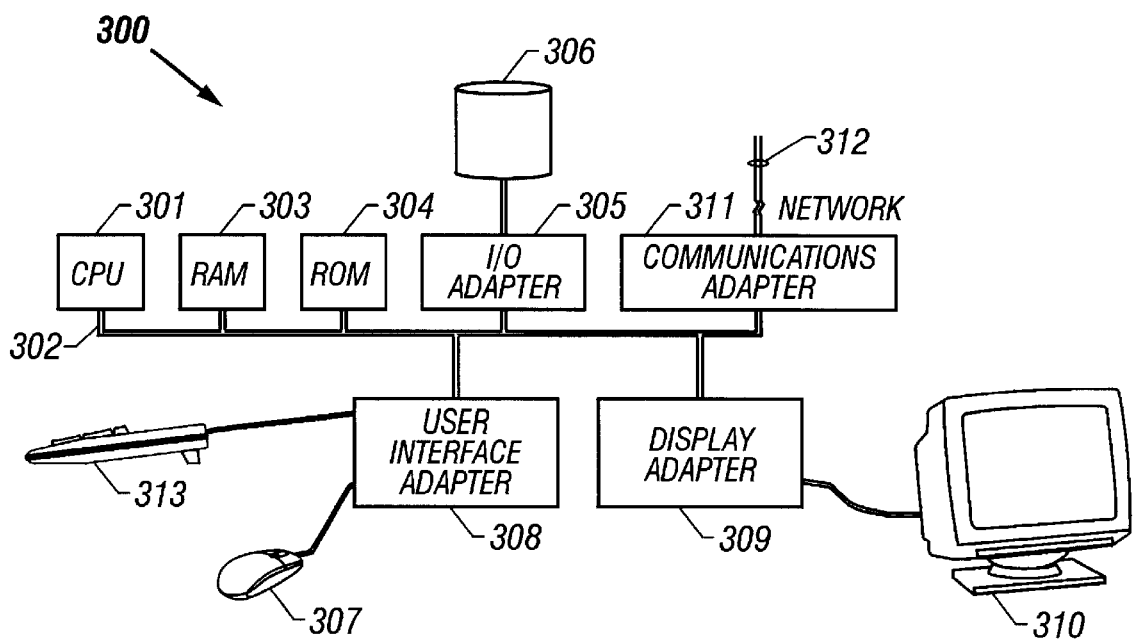
FIG. 3 shows one embodiment of the system adapted to use this invention.

FIG. 3 illustrates computer system 300 adapted to use the present invention. Central Processing Unit (CPU) 301 is coupled to system bus 302. CPU 301 may be any general purpose CPU, such as an HP PA-8500 or Intel Pentium processor. However, the present invention is not restricted by the architecture of CPU 301 as long as CPU 301 supports the inventive operations as described herein. System bus 302 is coupled to Random Access Memory (RAM) 303, which may be SRAM, DRAM or SDRAM. ROM 304 is also coupled to system bus 302, which may be PROM, EPROM, or EEPROM. RAM 303 and ROM 304 hold user and system data and programs as is well known in the art.

System bus 302 is also coupled to input/output (I/O) controller card 305, communications adapter card 311, user interface card 308, and display card 309. The I/O card 305 connects to storage devices 306, such as one or more of a hard drive, a CD drive, a floppy disk drive, a tape drive, to the computer system. Communications card 311 is adapted to couple computer system 300 to network 312, which may be one or more of a telephone network, a Local (LAN) and/or a Wide-Area (WAN) network, an Ethernet network, and/or the Internet network and can be wire line or wireless. User interface card 308 couples user input devices, such as keyboard 313 and pointing device 307, to computer system 300. Display card 309 is driven by CPU 301 to control display device 310.

What is claimed is:

1. A method of testing a circuit comprising the steps of:
   simulating said circuit to create a circuit simulator;
   generating an input vector to said circuit by entering test vectors into said circuit simulator;
   generating an expected output from said circuit in response to said generating step;
   testing said circuit with said input vector to yield a first resulting output;
   creating test hardware vectors to capture state information pertaining to said circuit;
   combining said test hardware vector with said input vector to create a joint input vector;
   debugging said circuit with said joint input vector to yield a second resulting output; and
   modifying said joint input vector.

2. The method of claim 1 wherein said circuit being tested is a microprocessor.

3. The method of claim 1 wherein said step of modifying said joint input vector is responsive to said second resulting output so as to minimize a difference between said expected output and said second resulting output.

4. The method of claim 1 wherein said step of modifying said joint input vector is performed to obtain test data from other cycles of the microprocessor under test, running a sequence of tests to obtain a continuum of test outputs and reconstruct the evolving state of said circuit.

5. The method of claim 1 wherein said step of testing tests one of a functional and an electrical design of said circuit.

6. The method of claim 1 wherein said step of creating test hardware vectors programs a test circuit resident on the chip within said circuit.

7. The method of claim 1 wherein said step of creating test hardware vector to capture state information captures register data stored in said circuit.

8. The method of claim 1 wherein said step of modifying said joint input vector is performed with a user interface wherein said user interface is independent of test equipment used in said step of generating said input vector and said expected output vector.

9. The method of claim 1 wherein said step of modifying said joint input vector is performed to eliminate differences between said second resulting output and said expected output.

10. A method of testing a circuit comprising the steps of:
creating a joint input vector which includes input vector information and test hardware vector information;
debugging said circuit with said joint input vector to yield a resulting output;
modifying said joint input vector to create a modified joint input vector; and
testing said circuit using said modified joint input vector.

11. The method of claim 10 wherein the circuit being tested is a microprocessor.

12. The method of claim 10 wherein said step of modifying said joint input vector is responsive to said resulting output so as to minimize a difference between said expected output and said resulting output.

13. The method of claim 10 wherein said step of modifying said joint input vector is performed to obtain test data from other cycles of the microprocessor under test, running a sequence of tests to obtain a continuum of test outputs and reconstruct the evolving state of said circuit.

14. The method of claim 10 wherein said step of creating a joint input vector which includes input vector information tests one of a functional and an electrical design of said circuit.

15. The method of claim 10 wherein said step of creating a joint input vector which includes test vector hardware information programs a test circuit resident on the chip within said circuit.

16. A testing device comprising:
a test vector integrator which joins an input vector with a test hardware vector to create a joint test vector;
a user interface configured for user modification of said joint test vector;
a display screen which allows display of said joint test vector;
an input device which accepts said inputs from said user; and
a processor which is used with said test vector integrator and is configured to modify said joint test vector.

17. The testing device of claim 16 wherein the joint test vector is configured to perform testing of said circuit.

18. The testing device of claim 16 wherein said processor is responsive to an input from the user to modify said joint test vector so as to minimize a difference between an expected output and a resulting output.

19. The testing device of claim 16 wherein said processor is responsive to an input from the user to modify said joint test vector to obtain test data from other cycles of a microprocessor under test, running a sequence of tests to obtain a continuum of test outputs and reconstruct the evolving state of the microprocessor.

20. The testing device of claim 16 wherein said processor is responsive to an input from the user of testing one of a functional design and an electrical design of said circuit.

* * * * *